United States Patent [19]

Lutes et al.

[11] Patent Number: 4,547,866

[45] Date of Patent: Oct. 15, 1985

[54] MAGNETIC THIN FILM MEMORY WITH ALL DUAL FUNCTION FILMS

[75] Inventors: Olin S. Lutes; Wayne L. Walters, both of Bloomington, Minn.

[73] Assignee: Honeywell Inc., Minneapolis, Minn.

[21] Appl. No.: 610,202

[22] Filed: May 14, 1984

Related U.S. Application Data

[63] Continuation-in-part of Ser. No. 507,391, Jun. 24, 1983, abandoned.

[51] Int. Cl.$^4$ ............................................. G11C 11/15
[52] U.S. Cl. ........................................ 365/173; 365/57
[58] Field of Search ................................... 365/173, 57

[56] References Cited

U.S. PATENT DOCUMENTS

| | | |
|---|---|---|
| 3,354,445 | 11/1967 | Prohofsky et al. |
| 3,375,091 | 3/1968 | Feldtkeller ............................ 365/173 |
| 3,375,503 | 3/1968 | Bertelsen |
| 3,440,626 | 4/1969 | Penoyer et al. |
| 3,452,334 | 6/1969 | Voegeli |
| 3,456,247 | 7/1969 | English |
| 3,573,760 | 4/1971 | Chang et al. ............................ 365/173 |

OTHER PUBLICATIONS

IBM Technical Disclosure Bulletin—vol. 5, No. 5, Oct. 1962, p. 35, vol. 8, No. 9, Feb. 1966, pp. 1263–1264, vol. 13, No. 7, Dec. 1970, pp. 2110–2111.

J. Raffel, "Future Developments in Large Magnetic Film Memories", J. Appl. Phys. 35, No. 3, 1964, pp. 748–753.

H. Chang, "0.25×10$^6$/in$^2$ NDRO Coupled Film Memory Elements", IEEE Mag 6, No. 4, 1970, pp. 774–778.

*Primary Examiner*—James W. Moffitt
*Attorney, Agent, or Firm*—Omund R. Dahle

[57] ABSTRACT

A non-volatile flat film memory with a symmetrical cell design having four magnetic films and full turn word line construction. The design provides flux closure during both store and read as well as providing memory storage in all films. The structure is fabricated on silicon using processes compatible with integrated circuit technology.

26 Claims, 16 Drawing Figures

(a)

(b)

MAGNETIC THIN FILM MEMORY WITH ALL DUAL FUNCTION FILMS

This application is a continuation-in-part of application Ser. No. 507,391, filed 6/24/83, now abandoned.

BACKGROUND AND SUMMARY OF THE INVENTION

The field of the invention is in non-volatile integrated circuit flat film memory. The non-volatility of magnetic memories (retention of data during a power outage) comes about from their rectangular hysteresis loop whereby the memory element retains its magnetization much as in a permanent magnet. Radiation hardness is also a natural consequence of the long-range order in ferromagnetics, which tends not to be disturbed by localized defects generated by radiation exposure. High cyclability is favored by the fact that long term changes in chemical composition due to extreme ambient conditions or to the magnetization process during read and write can be controlled by annealing and passivation.

The planar coupled film memory disclosed here differs from previous inventions in having a symmetrical structure of four magnetic films which provides a flux coupling during both the write and read process, and because its double word line structure, carrying oppositely directed currents, provides maximum noise reduction.

BRIEF DESCRIPTION OF THE DRAWINGS

FIG. 11a shows a square type cell while FIG. 11b shows a modified rectangular film.

DESCRIPTION

Cell Construction

Figure 1:
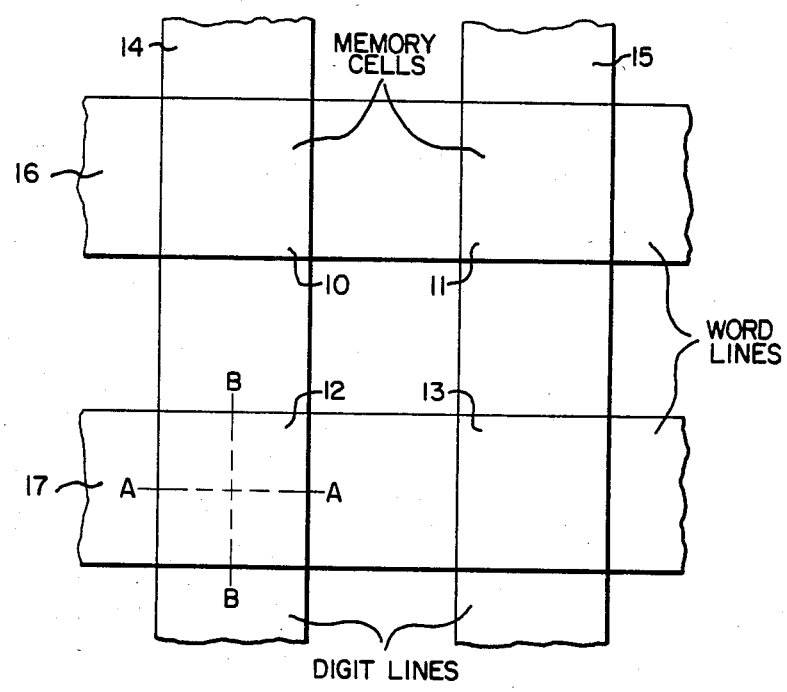
FIG. 1 shows a plan view of certain elements of the memory plane.

FIG. 1 shows in a plan view the memory cell construction. Four memory cells 10, 11, 12 and 13, of a much larger matrix, are shown along with "digit" lines 14 and 15 and "word" lines 16 and 17. Memory cell 12 is selected as representative and its silicon IC structure is shown in cross sectional views in FIG. 2 section A—A' and section B—B'. The cell 12 consists of four flat magnetic films 21, 22, 23 and 24 enclosing three metal film conductor lines 17, 14 and 17' and six insulator layers 31, 32, 33, 34, 35 and 36. The magnetic films are shown with square geometry but could also be circular, rectangular or other shapes. They are preferably of about 80Ni 20Fe non-magnetostrictive composition, but other compositions, for example, Ni—Fe—Co compositions may be used. The conductor lines, e.g. upper word line 17, digit line 14 and lower word line 17' (or FIG. 1, lines 14, 15, 16, 17) are normally of aluminum, copper, or an alloy thereof, but other metals such as chromium, gold, and various metal alloys are possible. The insulating layers 31, 32, 33, 34, 35 and 36 are preferably of silicon nitride, silicon dioxide, or silicon monoxide. The memory cell is conceived to function over a range of sizes. That is, both the lateral dimensions and the thickness of various layers are subject to choice. A lateral dimension of the magnetic films has a magnitude of about 100 micrometers while a typical layer thickness is a few tenths of one micrometer.

The memory structure is fabricated on a silicon substrate 40 using sputter or vapor deposition of the magnetic and metallic layers together with photolithographic techniques established in silicon planar IC processing. An important step in the magnetic film processing is the establishment of an easy axis of magnetization 41. This is accomplished by the application of a magnetic field during the film sputtering (or evaporation) such that the field direction coincides with the desired easy direction in the film. The direction of the easy axis 41 is chosen parallel to the two word lines in the memory cell described here.

Figure 3:
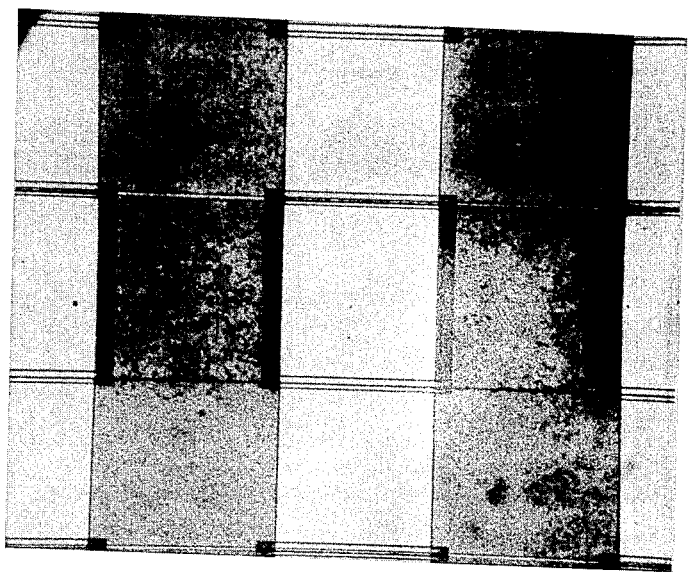
FIG. 3 is a photomicrograph of a memory cell array fabricated according to the principles of the invention.

A photomicrograph of part of a cell array is shown in FIG. 3. This array was fabricated at the Honeywell Corporation Technology Center following the above description. A complete cell outline is seen at the center of the photograph. In this example slightly different film dimensions are visible for the outer and inner films of the symmetrical structure.

Cell Operation

Figure 4:
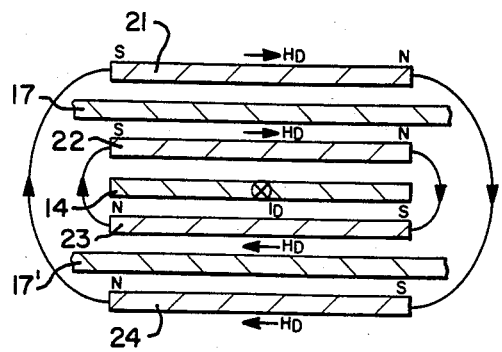
FIGS. 4a and 4b show flux linkage in the memory cell during "digit" current pulse and during "word" current pulse.
Figure 4:
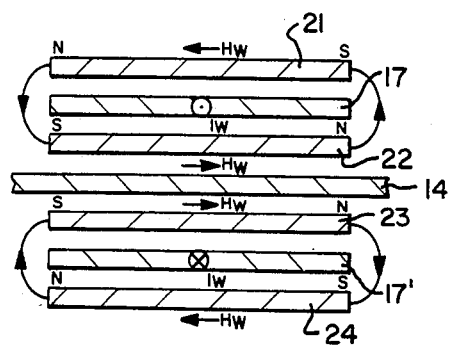

A "1" or "0" is stored in the memory cell 12 during the "write" operation by use of coincident current pulses in the digit 14 and word 17 lines. In this operation it is the sense of the digit current which determines the bit value, and the digit current is maintained for a short period after termination of the word current. FIG. 4a, which shows the flux linkage in the memory cell looking down the digit line 14 during a digit current pulse, shows the relation of digit current, magnetic fields, and flux in the four films 21, 22, 23 and 24 just before termination of the digit pulse. The digit current, with direction into the page, produces a magnetic field $H_D$ along the easy axis which magnetizes the films clockwise, that is, the two upper films are magnetized to the right as indicated by south and north magnetic pole symbols at the edges, while the two lower ones are to the left. This state of magnetization in the four films may be called a "1." Likewise a digit current of reversed sense, out of the page, would result in a counterclockwise magnetization, or a "0."

FIG. 4a indicates the flux closure in the four films that is present near the termination of the digit pulse and which is also present during the storage of a "1" in the memory cell. This flux closure during storage of a bit is an object of the invention. As a result of this closure, the demagnetizing fields acting on the films are much reduced, preventing loss of the stored information. This reduction of demagnetizing fields can be visualized in terms of the edge poles. Since there are equal numbers of south and north poles at each extremity of the cell, their fields tend to cancel, thus the demagnetizing field is small. The cancellation is more perfect, the greater is the ratio of film width to film separation. During write the word line current furnishes an auxiliary field in the hard direction (that is, perpendicular to the easy axis) to reduce the required digit current. The combination of word and digit fields during write also results in fast rotational switching.

The word line also provides means for reading the memory bit. During "read" the word current in word line 17, 17' is applied alone. The relation of the word current $I_W$ to its resultant magnetic field $H_W$ and resultant film magnetizations along the hard direction are shown in FIG. 4b. The magnetic field $H_W$ of the word current $I_W$ has equal contributions from the top and bottom word lines, with field directions as indicated. Note that the fields and magnetizations furnished by the word lines are at right angles to those furnished by the digit line and are along the hard direction of the film. Note also that the two inner films are magnetized in the opposite direction to that in the uppermost and lowermost magnetic films, furnishing flux closure as shown by the arrows and edge pole symbols. Because of this flux closure two advantages occur. First a reduction of stray magnetic fields outside the memory cell occurs due to the equal number of north and south poles at the film edges. Secondly the magnitude of the word current required during either write or read is greatly reduced by the flux coupling. Hence, a further object of the invention is accomplished, namely, flux closure in the hard direction during read or write.

A further object and advantage of the invention lies in the symmetrical geometry of the cell. The equal but opposite currents in the identical top and bottom word lines produce a magnetic field which is confined to the vicinity of the word lines and hence cause minimum disturbance at other locations.

The symmetrical structure set forth in this invention differs from the memory cell of Voegeli (U.S. Pat. No. 3,452,334). The latter utilizes only two magnetic films and requires a shared conducting ground plane for returning the word and digit currents. By use of two additional magnetic films the present invention eliminates the ground plane, which can transmit unwanted voltage signals from one current line to another.

It is noted that in the above description the four films all provide a dual function, that of information storage and flux coupling. The memory cell could also be made to operate with symmetrically disposed pairs of films having different degrees of magnetic anisotropy. For example, the topmost and bottommost films could have a different magnitude of uniaxial anisotropy field than the two inner films, thus permitting compensation for digit and word field differences at the two film pair locations. By appropriate choice of film thickness and magnetic anisotropy, the topmost and bottommost films could also be designed to operate solely as flux couplers, or "keepers", during read, without participating in memory storage.

Figure 5:
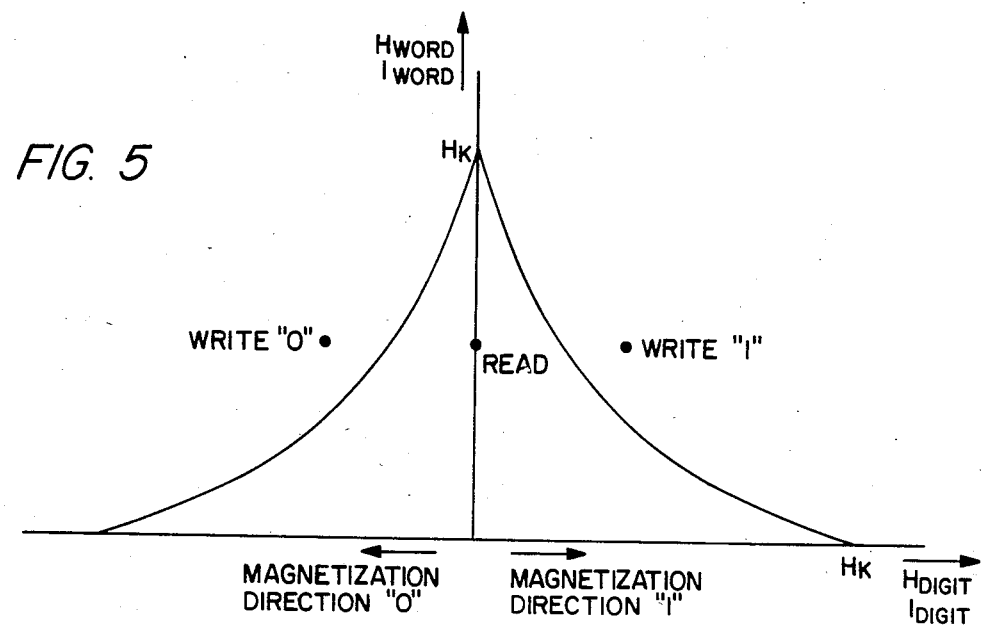
FIG. 5 shows the relation of the read and write fields to switching threshold curve.

FIG. 5 is a graphical presentation to show the relation of read and write fields to the switching threshold curve. Thus, to further illustrate rotational switching, FIG. 5 shows the well known switching threshold curve for rotational switching of an individual film. In this graph, the component of field resulting from the word current $H_W$ is plotted along the vertical axis, while the component due to the digit current $H_D$ is plotted along the horizontal axis. Therefore, any point in the plane represents a combination of a word and digit currents. For points inside the threshold curve, application of the magnetization away from the "1" or "0" axis, but upon removal of the field the magnetization vector returns to its original direction. Hence, the field is non-destructive, that is, it does not change the stored value of the bit. In particular, if the bit value is read by application of word current alone, the read field is represented by a point located on the vertical axis below the intersection of the two branches of the threshold curve. Application of this field results in non-destructive rotation of the magnetization vector from its undisturbed orientation to the right ("1") or left ("0"). Corresponding to this rotation the flux from the memory cell surrounding the digit line is reduced, giving a positive or negative voltage change in the sensing circuit, depending on whether the bit is a "1" or "0."

The write fields are represented by the two indicated points located outside the threshold curve. The point to the right is the field combination required to write a "1", and consists of a positively directed digit current $I_D$ together with word curent $I_W$ having the same word current as used for read. Providing the four films have approximately the same anisotropy field and thickness, they will all be governed by approximately the same threshold curve and they will all switch nearly in unison.

Figure 6:
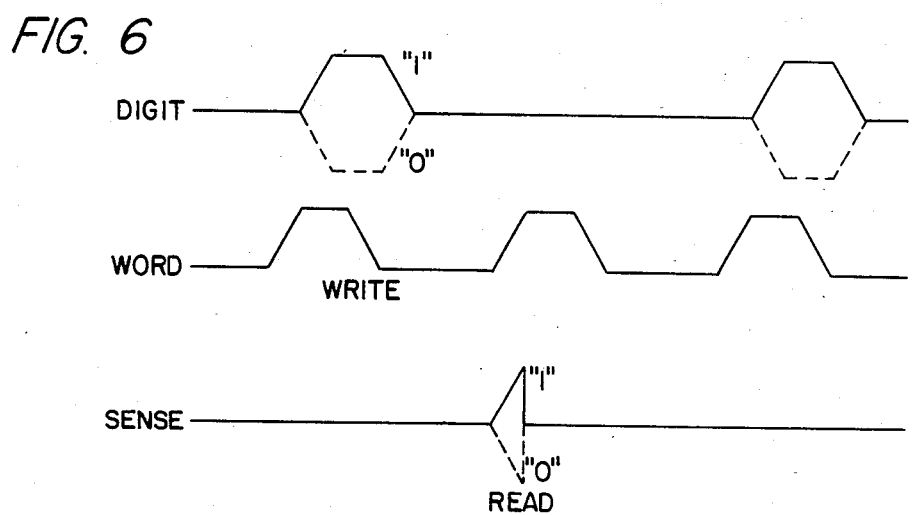
FIG. 6 is a drawing illustrating the timing of word and digit currents during memory operation as well as the occurrence of the sense output pulse.
Figure 7:
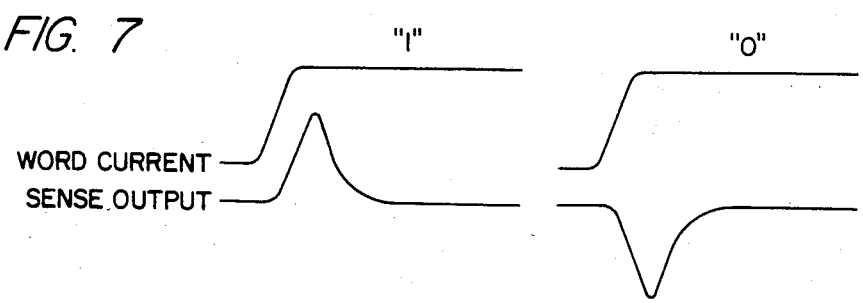
FIG. 7 is an oscilloscope photo showing word current traces and corresponding sense voltage traces during operation of a memory cell of the invention.

The relationships between word and digit currents and sense outputs are illustrated in FIG. 6. Each trace shows pulse amplitude as a function of time for the quantity indicated. The coincidence of word and digit currents during write and the occurrence of the sense amplifier output pulse during the rise time of the word current read pulse are shown. FIG. 7 is an oscilloscope trace photograph of word current read pulses (upper) and sense amplifier output pulses (lower) taken during testing of a memory cell constructed according to the invention. "1" and "0" outputs are shown.

Figure 8A:
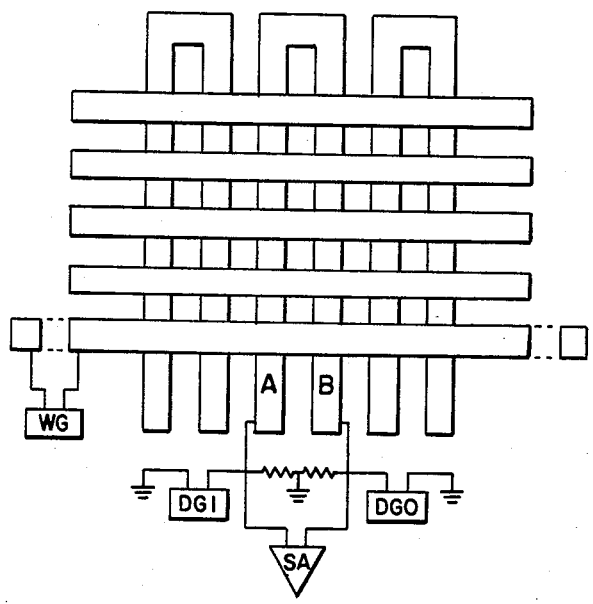
FIG. 8a is a schematic representation of the memory plane.
Figure 8B:
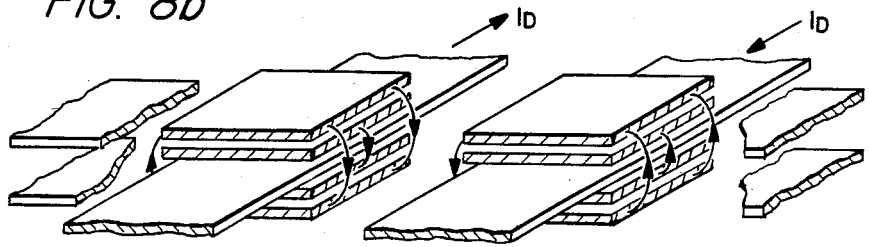
FIG. 8b is a pictorial representation of the flux linkage after "write."
Figure 8C:
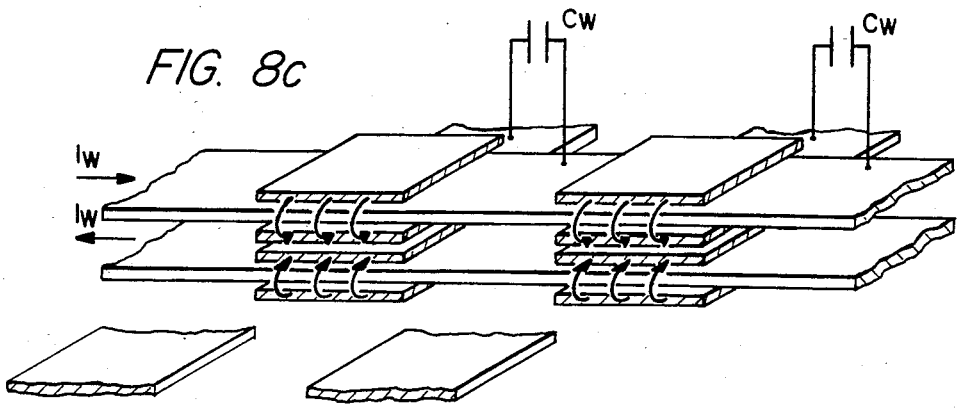
FIG. 8c is a pictorial representation of the flux linkage during "read."

FIGS. 8a, 8b and 8c further illustrate the cell and circuitry relations of the memory. FIG. 8a shows a schematic memory plane plan. In this plan, two cells are used to store one memory bit, for example cells A and B. Coincident currents from the word generator WG and one of the digit currents generators $DG_1$ or $DG_0$ serve to write a "1" or "0" in the cell combination A and B. Following write, a word current pulse from WG serves to read the value of the bit. FIGS. 8b and 8c are cutaway views of memory cells A and B that show the flux linkages in the memory cells before and during read of a "1" bit. For clarity, details of insulating layers are not shown. FIG. 8b shows that in the stored condition the flux from the four films completely closes around the digit line in each cell. Furthermore, the flux contributions are additive so that flux from both cells is directed downward in the area between the cells. Referring back to FIG. 8a, the circuit loop comprising the two digit lines and the differential sense amplifier SA has a net magnetic flux pointing downward inside the loop.

Referring now to FIG. 8c, the flux linkage is shown during application of a strong word current from generator WG. In this case the flux from the four films closes around the word lines in each cell, as was also previously shown in FIG. 4b. In addition, it can be seen that there is no longer flux closure around the digit lines. Referring again to FIG. 8a, there is no longer flux through the loop comprising the two digit lines and the sense amplifier.

The change in flux through the sense amplifier loop resulting from the word current gives a voltage output according to Faraday's law which is read by the sense amp and which corresponds to the memory location selected by the particular word line and digit line pair. If instead of a "1" a "0" had been written in the cell combination A and B, the flux directions of FIGS. 8b and 8c would be reversed, and the sign of the sense amplifier output would also be reversed, thus enabling the distinction between a "1" and a "0."

It is noted that for FIG. 8c it was assumed that a strong enough word current was applied to completely magnetize the films in the hard direction. However, in practice, as was discussed in connection with FIG. 5, a smaller word current is applied to allow non-destructive readout. In this case some residual flux closure around the digit line remains. Though this results in a smaller output, it does not change the basic principle of operation as described above.

The advantage of the proposed symmetrical structure in noise reduction may be understood using FIG. 8c. Noise contributions to the sense output may occur due to direct inductive and capacitive coupling between word and digit lines. Such noise contributions are reduced by the present design. The inductive coupling is minimized by cancellation of external word line fields due to equal but opposite currents in the upper and lower word lines, as previously discussed. Furthermore, the noise coupled through the inter-line capacitance $C_{WD}$ (FIG. 8c) during voltage transients on the word line are balanced due to the use of two cells per bit. This balanced common-mode signal can be eliminated via a differential amplifier, while the desired differential magnetic film signals are amplified, resulting in maximum signal-to-noise ratio. Further reduction in system noise can be obtained by driving the word and digit line differentially.

Film Modifications

Figure 2:
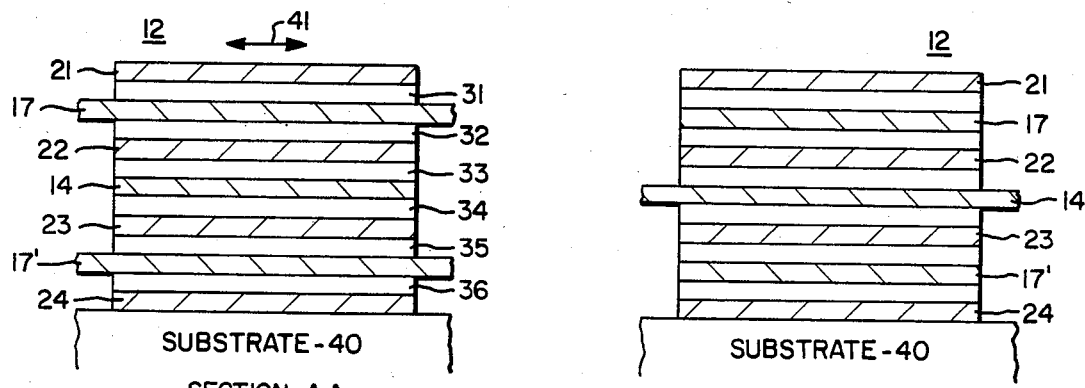
FIG. 2 shows two memory cell cross sections taken from FIG. 1.
Figure 9:
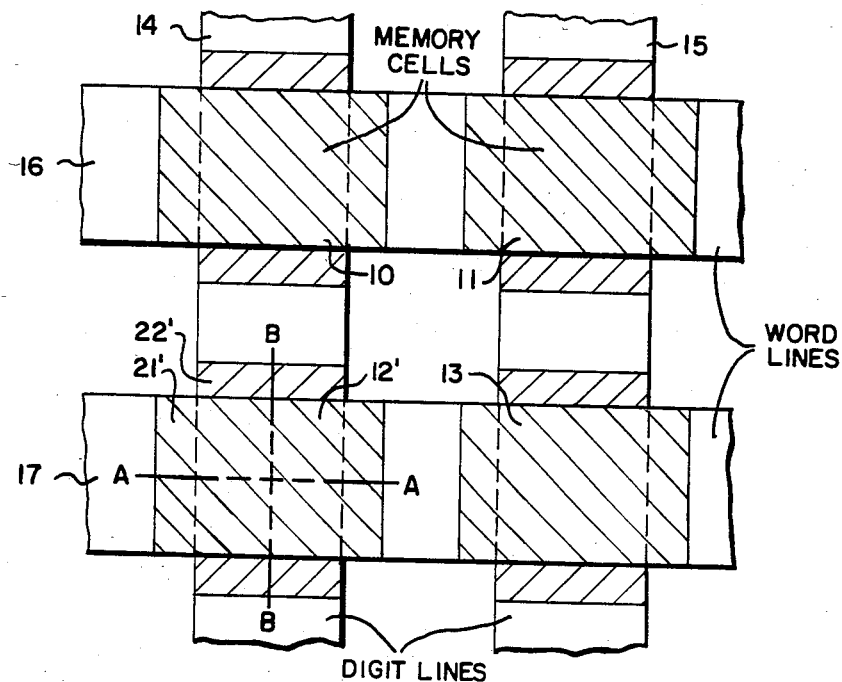
FIG. 9 shows a plan view of certain modified film elements of the memory plane.
Figure 10:
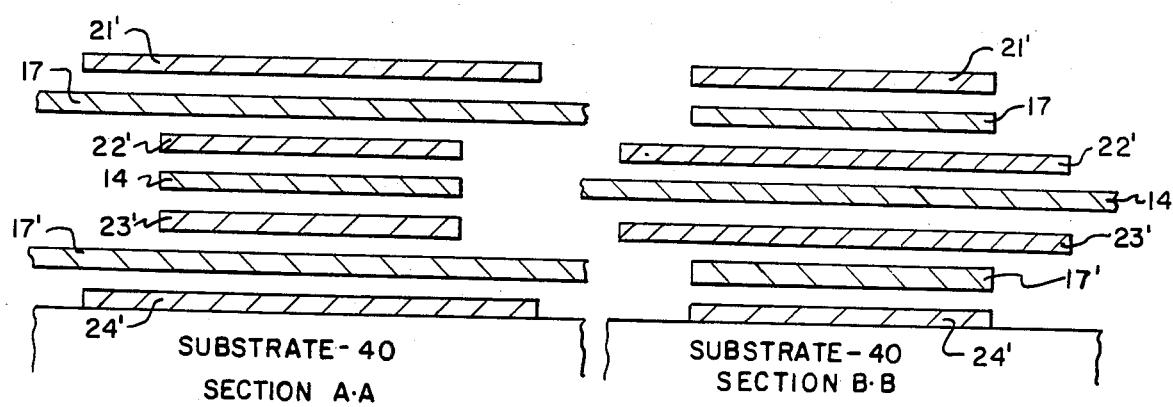
FIG. 10 shows two memory cell cross sections taken from FIG. 9 and showing the extended films.

FIGS. 9 and 10 are similar to FIGS. 1 and 2 explained in detail above, however it can be seen in FIGS. 9 and 10 that the top and bottom magnetic films 21' and 24' are extended in length beyond the intersection area along the word line 17 direction while the inner two films 22' and 24' are extended in length beyond the intersection area in the digit line 14 direction in order to help optimize the thin film memory operation.

The active film region for each film in FIG. 9, comprising the common area shared by the intersection (i.e. the intersection area) of the digit and word lines, is approximately the same as in the original square structure shown in FIG. 1, that is, it is approximately the square region defined by the intersection of the transversely positioned word 17 and digit 14 lines. In FIGS. 1 and 2 the digit and word lines are shown of a common width. It is this region which can be switched by the magnetic fields from coincident currents in the two intersecting lines. However, in contrast to the square film case, in FIG. 9 the magnetic films themselves extend beyond the active regions rather than ending abrubptly at the intersection boundary. Hence the structure is more conducive to a gradual rather than an abrupt change of magnetization at the cell edges. Thus in the structure shown in FIG. 9 four cells are shown in a plan view similar to that of FIG. 1. Identifying numbers of the modified films in FIGS. 9 and 10 have been given numbers which are primed.

Again memory cell 12' is selected as representative and its silicon IC structure is shown in cross sectional views in FIG. 10 section A—A and section B—B. In FIG. 10, in order to simplify the drawing, the details of the insulating layers 31, 32, 33, 34, 35 and 36 are not shown. These insulating layers have been adequately described in connection with FIG. 2, and are actually in place in the device of FIGS. 9 and 10, and may be modified in shape along with the films to properly separate the several layers. While all four films have been shown to be extended, it is possible to extend the top and bottom films 21' and 24' while leaving the two inner films unchanged or conversely the two inner films 22' and 23' may be extended without changing the top and bottom films.

In operation, the extended films help improve the overall results through providing a more uniform field; in other words, the magnetic fields produced by the currents in the word and digit lines become more uniform in the case of the extended films.

Figure 11:
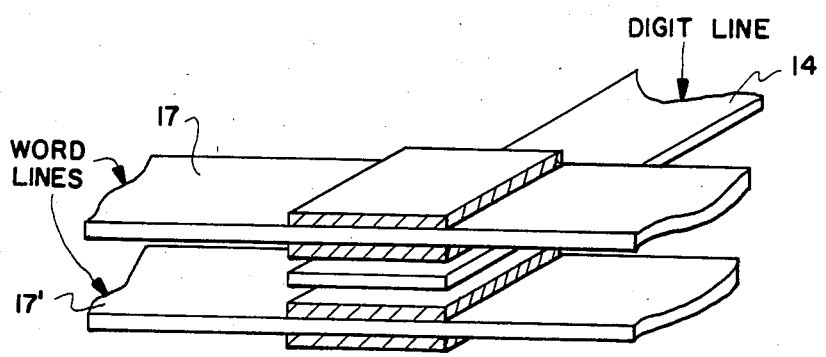
Figure 11:
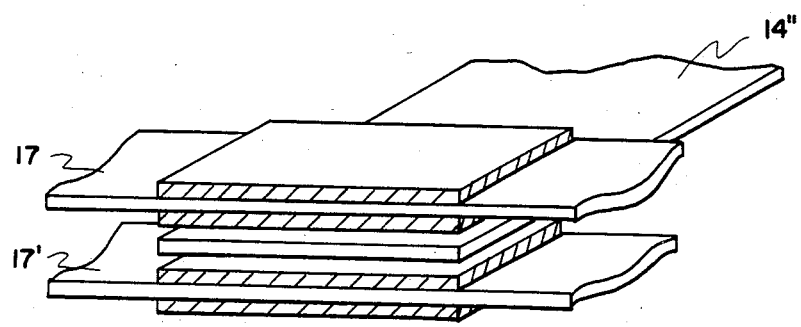

Another film modification approach is shown in FIG. 11, and may be called the rectangular cell. In this figure, as in FIG. 10, the details of the insulating layers 31, 32, 33, 34, 35 and 36 are not shown again, since they are adequately shown and described in FIG. 2. FIG. 11 shows a comparison of (a) the original square type cell of FIGS. 1 and 2 and (b) a rectangular cell construction. In the latter construction of FIG. 11b all four memory films 21'', 22'', 23'' and 24'' have been lengthened in the direction parallel to the word lines 17 and 17' which is also the easy direction of magnetization of the films. As a result of the film lengthening all four films are now rectangular films. At the same time the digit line 14'' passing through the cell has been widened so that its width matches the long dimension of the rectangular films.

The operation of the memory cell, for read and write is described above and is the same in principle whether the cell geometry is square or rectangular. The advantage of the rectangular shape lies in the increased strength of the stored information bit following a write operation. This is due to the smaller demagnetizing effect in a longer magnetized object compared to a short one.

Following write the two upper films are magnetized in a direction opposite to the magnetized direction of the lower two films, as is illustrated in FIG. 8b. Magnetic flux is thus coupled from the upper two films to the lower two films. This coupling is weakened by the demagnetizing field present in each film due to its own edge poles together with the edge poles of the other films.

Figure 12:
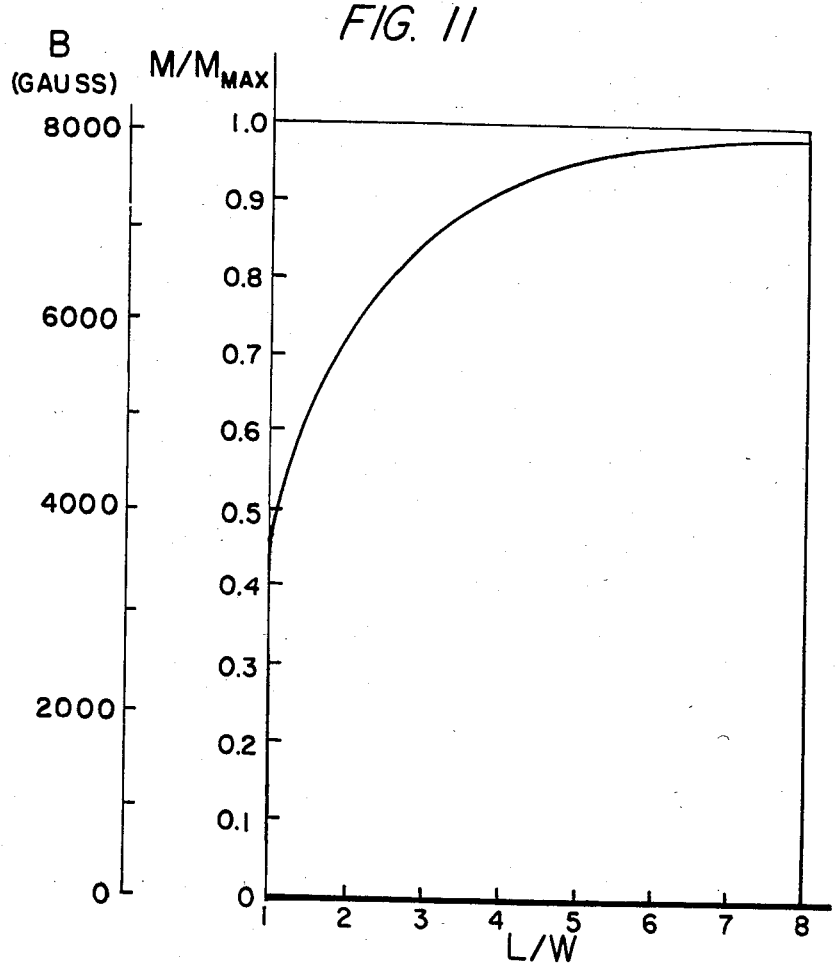
FIG. 12 is a graphical presentation of the results of modifying according to FIG. 11.

In the course of our studies we have developed an analytical model of the demagnetizing effect which calculates the equilibrium distribution of magnetization intensity or flux density throughout each film following write, based on the film dimension and separations. In particular, a calculation was made of the average magnetization intensity in rectangular cell structures for different values of length-to-width ratio (L/W). A typical result is shown by the graph of FIG. 12. This graph was based on a cell structure in which all magnetic films had a width (W) of 50 micrometers and the total thickness of the structure from top to bottom was 6.5 micrometers. Different values of length (L) between 50 and 400 micrometers were assumed giving L/W values between 1 (square shape) and 8 (for most extended rectangular shape). Typical values of coercivity, saturation flux density, and retentivity for permalloy films were assumed in the calculation. The X-coordinate of the graph is the L/W ratio. The Y-coordinate is the ratio of calculated magnetization to the maximum magnetization intensity which would be theoretically possible. This ratio is denoted $M/M_{max}$ and is a measure of the strength of the stored magnetization. In addition to $M/M_{max}$, the flux density B, in Gauss, is also shown on the Y-coordinate axis.

FIG. 12 shows that the strength of stored magnetization increases with L/W, thus the rectangular structure leads to a stronger stored memory bit. The advantage lies both in lower susceptibility to loss of stored information and in a higher output signal during reading of the bit.

The embodiments of the invention in which an exclusive property or rights is claimed are defined as follows:

1. Symmetrical planar coupled film magnetic memory cell structure comprising:
   a central flat "digit" conductor line;
   first and second flat magnetic films symmetrically situated above and below said central conductor and insulated therefrom said films having uniaxial anisotropy where the easy axis of magnetization is at right angles to the digit line direction;
   second and third flat "word" conductor lines symmetrically situated outside said first and second magnetic films, respectively, and insulated therefrom;
   and third and fourth flat magnetic films symmetrically situated outside said second and third "word" conductor lines, respectively, and insulated therefrom, said films having the same easy axis and approximately the same anisotropy strength as the first and second films.

2. A memory cell according to claim 1 in which said magnetic films are on the order of one half micrometer in thickness.

3. A memory cell according to claim 1 in which said memory cell films are deposited on silicon, and are delineated by photolithographic procedures consistent with standard silicon processing.

4. A memory cell according to claim 1 in which said magnetic films, said insulating films and said conductor lines are all on the order of the same thickness.

5. A memory cell according to claim 4 in which each of said films and conductor lines is on the order of one half micrometer in thickness.

6. The memory cell structure according to claim 1 in which the digit conductor line runs transversely to the second and third word conductor lines.

7. The memory cell structure according to claim 6 in which the common area shared by the intersection (i.e. intersection area) of the digit and word lines defines an active film area.

8. The memory cell structure according to claim 7 in which the third and fourth magnetic films are extended in length beyond the intersection area along the direction of the word lines.

9. The memory cell structure according to claim 7 in which the first and second magnetic films are extended in length beyond the intersection area along the direction of the digit line.

10. The memory cell structure according to claim 7 in which the first and second magnetic films are extended in length beyond the intersection area along the direction of the digit line, and in which the third and fourth magnetic films are extended in length beyond the intersection area along the direction of the word lines.

11. The memory cell structure according to claim 7 in which each of the magnetic films is substantially coincident in area with the intersection area.

12. The memory cell structure according to claim 7 in which the digit and word lines are of a common width wherein the intersection area is relatively square.

13. The memory cell structure according to claim 7 in which the digit line is made substantially wider than the word line wherein the active film intersection area is an elongated rectangle, each of said magnetic films being substantially coincident in shape and area with the elongated rectangle intersection area.

14. A memory cell according to claim 1 in which the stored information is stored in both the third and fourth magnetic films as well as in the first and second magnetic films.

15. A symmetrical coupled film magnetic memory cell structure comprising:
   a semiconductor substrate means having a planar surface;
   a first flat magnetic film deposited on said substrate means surface;
   a first flat insulating film deposited over said magnetic film;
   a first flat word conductor line deposited on said insulating film;
   a second flat insulating film deposited over said first word conductor line;
   a second flat magnetic film deposited on said second insulating film;
   a third flat insulating film deposited over said second magnetic film;
   a flat digit conductor line deposited on said third insulating film;
   a fourth flat insulating film deposited over said digit conductor line;
   a third flat magnetic film deposited on said fourth insulating film said third and second magnetic films having uniaxial anisotropy where the easy axis of magnetization is at right angles to the digit line direction;
   a fifth flat insulating film deposited over said third magnetic film;
   a second flat word conductor line deposited on said fifth insulating film;
   a sixth flat insulating film deposited over said second word conductor line; and,
   a fourth flat magnetic film deposited on said sixth insulating film said fourth and first magnetic films having the same easy axis and approximately the same anisotropy strength as the third and second magnetic films.

16. The memory cell structure according to claim 15 in which the magnetic films are of a composition of about 80% nickel 20% iron.

17. The memory cell structure according to claim 15 in which the first and second word conductor lines are at right angles to the digit conductor line.

18. The memory cell structure according to claim 17 in which the flux linkage during "digit" current pulse is from the first and second magnetic films to the third and fourth magnetic films, and during "word" current pulse is from the first to the second magnetic film and from the third to the four magnetic film.

19. The memory cell structure according to claim 15 in which the digit conductor line runs transversely to the first and second word lines.

20. The memory cell structure according to claim 19 in which the common area shared by the intersection (i.e. the intersection area) of the digit and word lines defines an active film area.

21. The memory cell structure according to claim 20 in which the first and fourth magnetic films are extended in length beyond the intersection area along the direction of the word lines.

22. The memory cell structure according to claim 20 in which the second and third magnetic films are extended in length beyond the intersection area along the direction of the digit line.

23. The memory cell structure according to claim 20 in which the first and fourth magnetic films are extended in length beyond the intersection area along the direction of the word lines, and in which the second and third magnetic films are extended in length beyond the intersection area along the direction of the digit line.

24. The memory cell structure according to claim 20 in which each of the magnetic films is substantially coincident in area with the intersection area.

25. The memory cell structure according to claim 20 in which the digit and word lines are of a common width wherein the intersection area is relatively square.

26. A memory cell structure according to claim 15 in which said first, second, third and fourth magnetic films each have a thickness of about one half micrometers.

* * * * *